(12) United States Patent
Nakajima et al.

(10) Patent No.: US 7,862,677 B2
(45) Date of Patent: *Jan. 4, 2011

(54) DISPLAY DEVICE AND METHOD OF MANUFACTURING THE SAME

(75) Inventors: Setsuo Nakajima, Kanagawa-Ken (JP); Shunpei Yamazaki, Kanagawa-Ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1253 days.

This patent is subject to a terminal disclaimer.

(21) Appl. No.: 11/421,168

(22) Filed: May 31, 2006

(65) Prior Publication Data

US 2006/0207714 A1    Sep. 21, 2006

Related U.S. Application Data

(62) Division of application No. 09/760,499, filed on Jan. 11, 2001, now Pat. No. 7,060,153.

(30) Foreign Application Priority Data

Jan. 17, 2000    (JP)    ............ 2000-008403

(51) Int. Cl.
*B32B 37/00*    (2006.01)
(52) U.S. Cl. .............. 156/249; 156/247; 156/344; 438/29; 438/456; 438/977
(58) Field of Classification Search ............ 156/247, 156/249, 344; 438/29, 456, 977
See application file for complete search history.

(56) References Cited

U.S. PATENT DOCUMENTS

| | | | |
|---|---|---|---|
| 5,206,749 A | 4/1993 | Zavracky et al. | |
| 5,317,236 A | 5/1994 | Zavracky et al. | |
| 5,376,561 A | 12/1994 | Vu et al. | |
| 5,494,699 A * | 2/1996 | Chung | ............ 427/66 |
| 5,757,456 A | 5/1998 | Yamazaki et al. | |
| 5,821,138 A | 10/1998 | Yamazaki et al. | |
| 5,834,327 A | 11/1998 | Yamazaki et al. | |
| 6,043,800 A | 3/2000 | Spitzer et al. | |
| 6,118,502 A | 9/2000 | Yamazaki et al. | |

(Continued)

FOREIGN PATENT DOCUMENTS

JP    8-96959    4/1996

(Continued)

OTHER PUBLICATIONS

Shimoda, et al., "Surface Free Technology by Laser Annealing (SUFTLA)", IEDM Technical Digest, 1999, pp. 289-292.

*Primary Examiner*—John L Goff
(74) *Attorney, Agent, or Firm*—Fish & Richardson P.C.

(57) ABSTRACT

To provide a technique for manufacturing a high-performance display device by employing a plastic substrate. A peeling layer is formed on an element-forming substrate, and a semiconductor element and a luminous element are further formed thereon. Then, a fixed substrate (130) is bonded on the luminous element by using a first adhesive (129). The entire substrate in this state is exposed in a gas containing halogen fluoride to thereby remove the peeling layer and separate the element-forming substrate. Thereafter, a bonding substrate (132) that comprises a plastic substrate is bonded in place of the separated element-forming substrate.

13 Claims, 9 Drawing Sheets

U.S. PATENT DOCUMENTS 6,376,333 B1 4/2002 Yamazaki et al.
7,060,153 B2 * 6/2006 Yamazaki et al. ........... 156/249

FOREIGN PATENT DOCUMENTS

| JP | 8-254686  | 10/1996 |
| JP | 8-288522  | 11/1996 |
| JP | 9-63770   | 3/1997  |
| JP | 9-312260  | 12/1997 |
| JP | 10-247735 | 9/1998  |
| JP | 10-270363 | 10/1998 |
| JP | 11-191628 | 7/1999  |

* cited by examiner

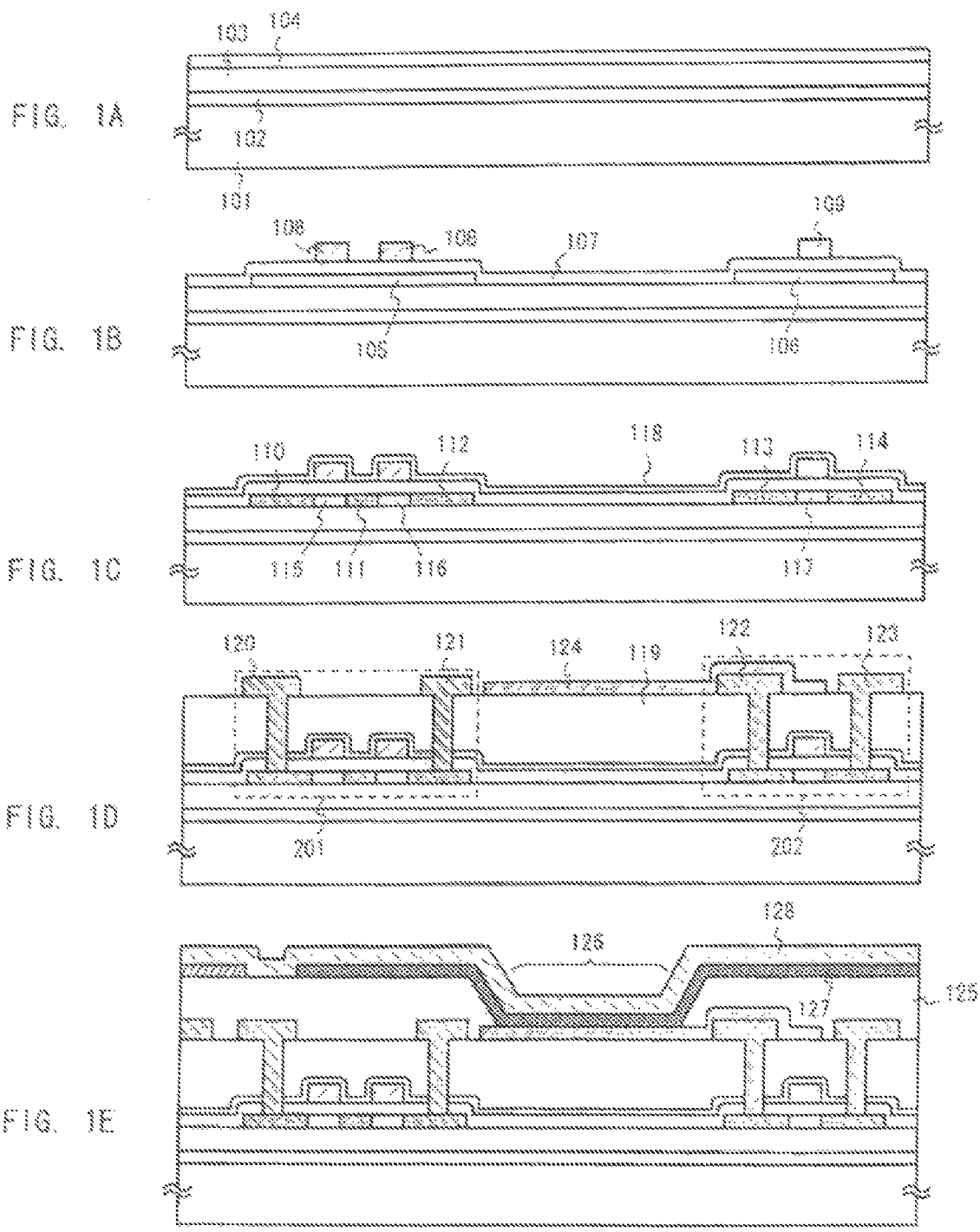

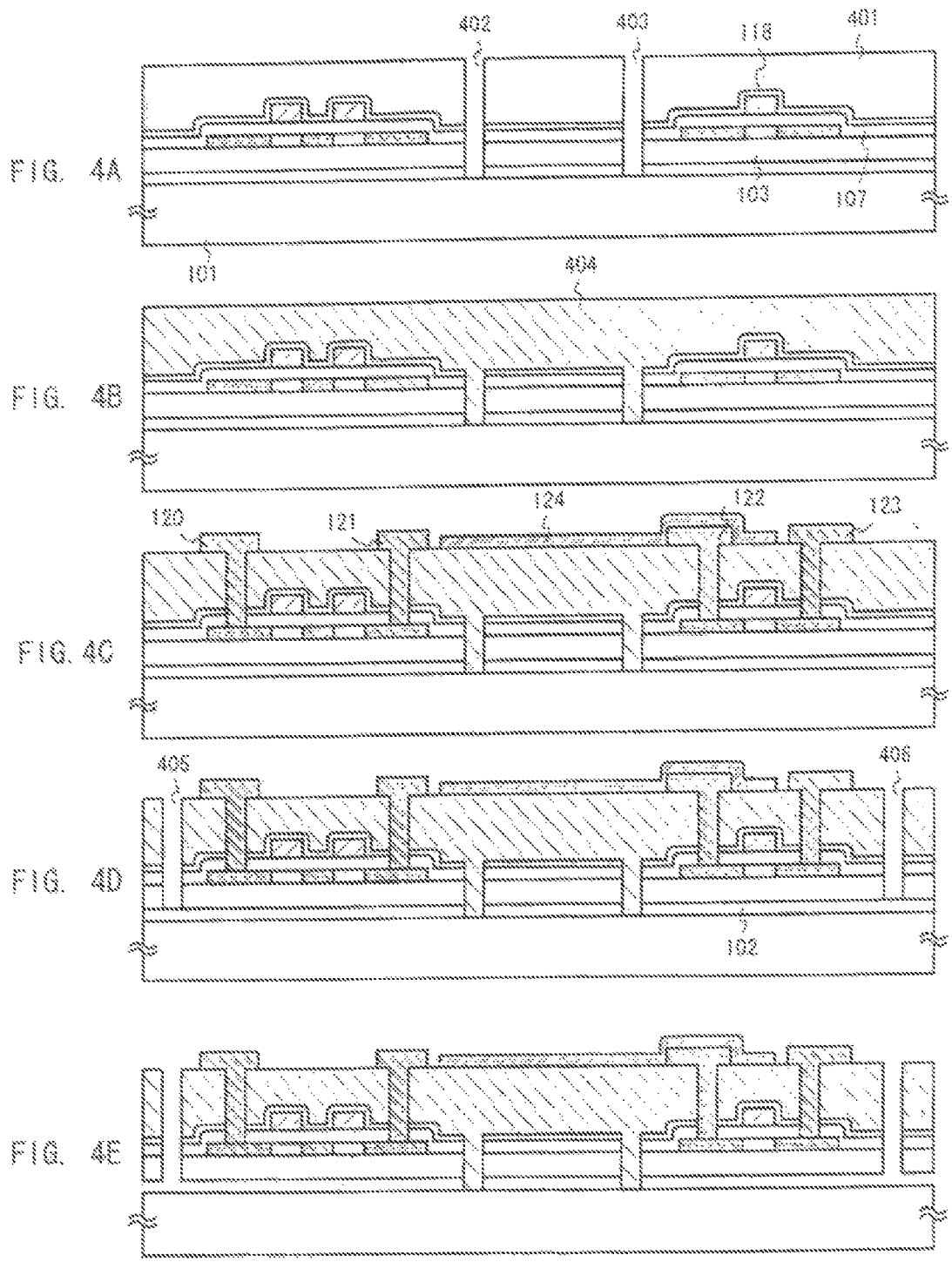

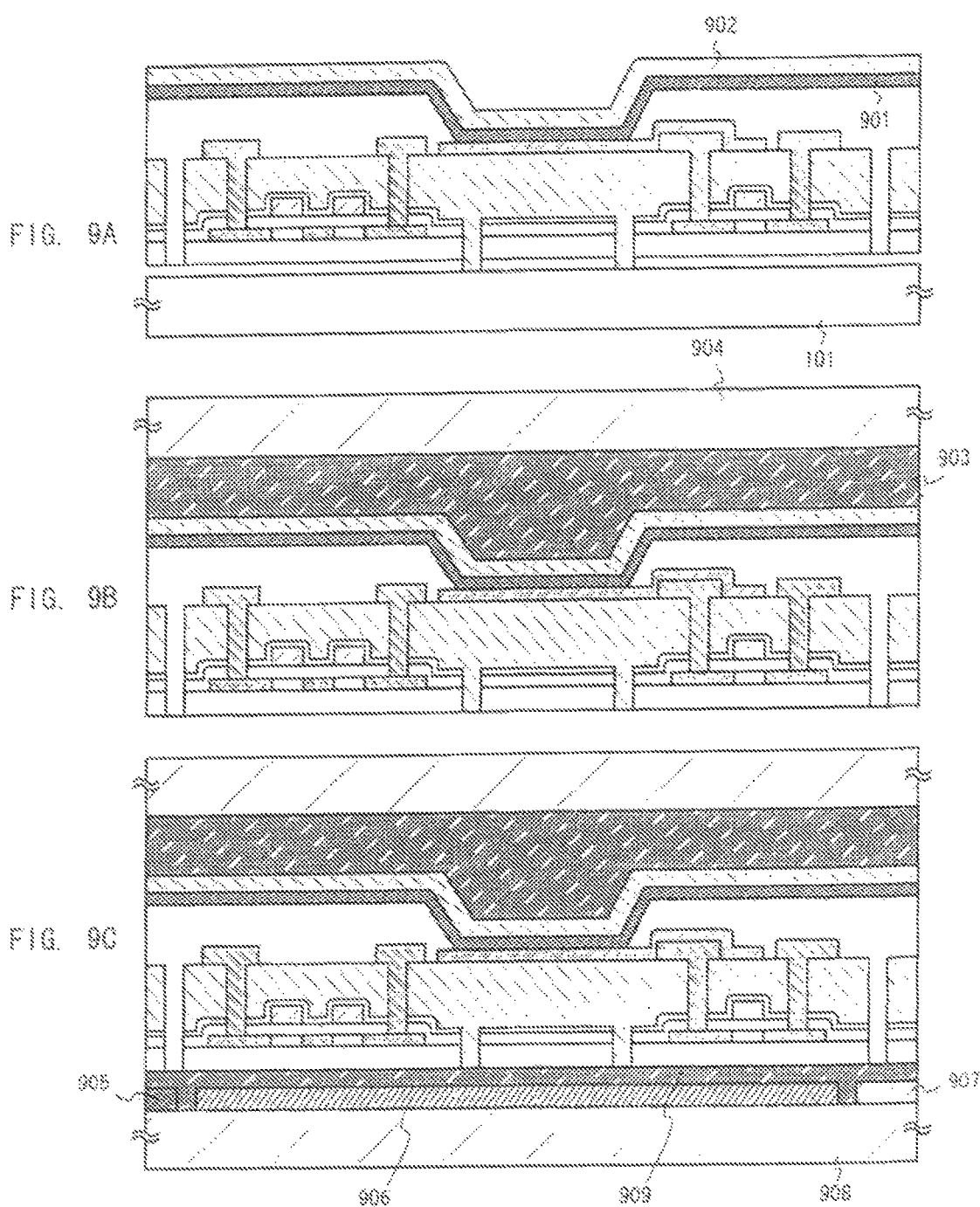

DISPLAY DEVICE AND METHOD OF MANUFACTURING THE SAME

BACKGROUND OF THE INVENTION

1. Field of the Invention

The present invention relates to a method of manufacturing a device having an element (hereinafter referred to as luminous element) that is comprised of a luminous material sandwiched between electrodes (the device will herein after be referred to as light-emitting device), or to a device having an element (hereinafter referred to as liquid crystal element) that is comprised of a liquid crystal sandwiched between electrodes (the device will hereinafter be referred to as liquid crystal display device). Note that a display device herein is a generic term referring to a light-emitting device and a liquid-crystal display device.

2. Description of the Related Art

In recent years, development is proceeding in a light-emitting device (also called as a light-emitting diode or an EL display device) using a luminous element (hereinafter referred to as EL element) that utilizes a luminous material in which EL (Electro luminescence) can be obtained (hereinafter referred to as EL material). The EL display device is composed of a structure that has an EL element constructed of an anode, a cathode, and an EL material sandwiched therebetween. By applying a voltage between the anode and the cathode top allow current flow in the EL material, carries re-couple to thereby make the EL element emit light. In other words, the EL display device is a display device that uses a luminous element which itself has a light-emitting ability, that is, it is self-emissive, and hence, unlike a liquid crystal display device, it does not need a back light. In addition, the EL display device has merits such as a wide field of vision, is light in weight, and a low power consumption.

Various kinds of applications employing such EL display device are expected. In particular, because the thickness of the EL display device is thin, thereby being capable of making the EL display device light in weight, its usage in portable equipment is attracting much attention. Therefore, attempts have been made in forming a luminous element on a flexible plastic film.

However, the heat resistance of a plastic film is low, and therefore the highest temperature of a process must be lowered. As a result, the present situation is that TFT having a good electric characteristic as when formed on a glass substrate cannot be manufactured. Thus, a high-performance display device employing a plastic film has not been realized.

SUMMARY OF THE INVENTION

The present invention has been made in view of the above, and therefore has an object to provide a technique for manufacturing a high-performance display device by employing a plastic substrate (includes a flexuous plastic film or a plastic substrate).

The present invention is characterized in that necessary elements are first formed on a substrate (glass substrate, quartz substrate, silicon substrate, metallic substrate, or a ceramic substrate) that has more heat resistance compared with a plastic one, and then the elements are transferred to a plastic substrate by a process conducted at room temperature.

It is to be noted that the above-mentioned necessary elements indicate a semiconductor element (typically a thin film transistor) that is employed as a switching element of a pixel in an active matrix type display device, or an MIM element and a luminous element or a liquid crystal element. Further, the above-mentioned necessary elements also indicate a luminous element or a liquid crystal element in case of a passive type display device. As the plastic substrate, PES (polyethylene sulfide), PC (polycarbonate), PET (polyethylene terephthalate), or PEN (polyethylene naphthalate) can be used.

In the present invention, the above-mentioned elements are formed on a peeling lever that comprises a silicon film (silicon germanium film may be used, too), and then the peeling layer is removed by using a gas containing halogen fluoride in a final process. As a result, the respective elements and the substrate are separated from each other. Thereafter, it becomes possible to adhere the elements on the plastic substrate. Since the etching of the silicon film by halogen fluoride readily proceeds at room temperature, the process can be performed without any problem after the formation of a luminous element that is low in heat resistance.

Halogen fluoride is a substance expressed by the chemical formula $Xfn$ (where X is a halogen other than fluoride and "n" is an integer). Chlorine fluoride (ClF), chlorine trifluoride ($ClF_3$), bromine fluoride (BrF), bromine trifluoride ($BrF_3$), iodine fluoride (IF), and iodine trifluoride ($IF_3$) can be used. In addition, the silicon film may be a crystalline silicon film or an amorphous silicon film. A selective ratio of the silicon film and a silicon oxide film is large, and therefore a selective etching of the silicon film by the halogen fluoride is possible.

Note that the silicon film is etched just by exposing it to the halogen fluoride. However, even if another fluoride (carbon tetrafluoride ($CF_4$) or nitrogen trifluoride) is used, the present invention may employ it by making it into a plasma state.

BRIEF DESCRIPTION OF THE DRAWINGS

The above and other objects and features of the present invention will be more apparent from the following FIGS. 1A to 1E are diagrams showing manufacturing processes of an EL display device;

FIGS. 4A to 4E are diagrams showing manufacturing processes of an EL display device;

FIGS. 9A to 9C are diagrams showing manufacturing processes of an EL display device.

DETAILED DESCRIPTION OF THE PREFERRED EMBODIMENTS

Figure 2A:
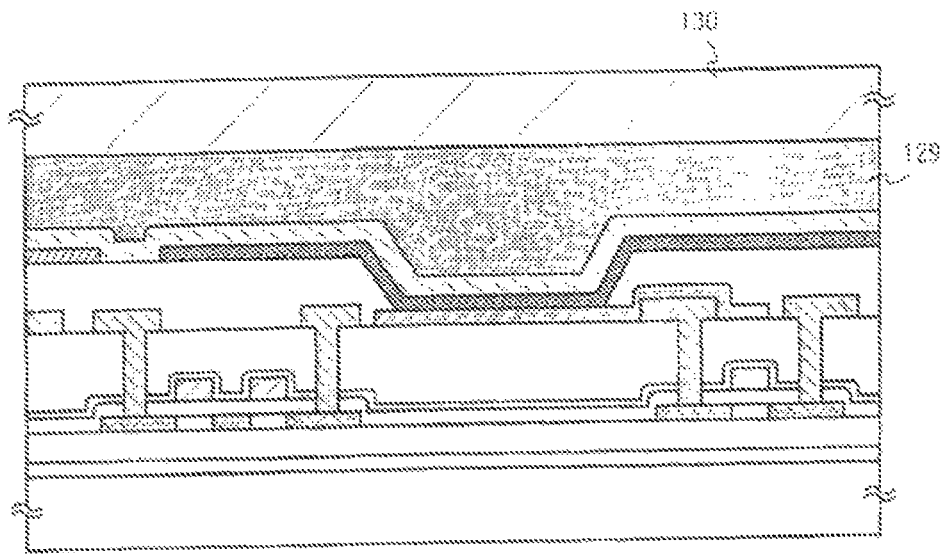
FIGS. 2A to 2C are diagrams showing manufacturing processes of an EL display device.

An embodiment mode of the present invention will be explained with reference to FIGS. 1A to 1E and FIGS. 2A to 2C. Note that shown in FIGS. 1A to 1E and FIGS. 2A to 2C are cross-sectional views illustrating manufacturing processes in a pixel rotation. In addition, a top view of a pixel that is formed in accordance with this embodiment mode is shown in FIG. 3A. The reference symbols used to FIGS. 3A and 3B correspond with those used in FIGS. 1A to 1E and FIGS. 2A to 2C.

In FIG. 1A, reference symbol 101 denotes a substrate on which elements will be formed (the substrate will hereinafter be referred to as element-forming substrate) and a peeling layer 102 comprising an amorphous silicon film is formed thereon to a thickness of between 100 and 500 nm (300 nm in this embodiment mode). In this embodiment mode, a glass substrate is used as the element-forming substrate 101. However, a quartz substrate, a silicon substrate, a metallic substrate, or a ceramic substrate may be used. It is to be noted that throughout the present specification, the whole substrate having a semiconductor element or a luminous element formed thereon is referred to as an element-forming substrate in some cases.

The peeling layer 102 may be formed by low pressure thermal CVD, plasma CVD, sputtering, or evaporation. An insulating layer 103 comprising a silicon oxide film is formed to a thickness of 200 nm on the peeling layer 102. The insulating layer 103 may be formed by low pressure thermal CVD, plasma CVD, sputtering, or evaporation.

A crystalline silicon film 104 is next formed to a thickness of 50 nm on the insulating layer 103. A known method may be used as the formation method of the crystalline silicon film 104. An amorphous silicon film may be crystallized by a laser using a fixed laser or an excimer laser, or it may be crystallized by undergoing a heat treatment (furnace annealing).

Next, as shown in FIG. 1B, the crystalline silicon film 104 is patterned to form island-like crystalline silicon films 105 and 106 (hereinafter referred to as active layers). Then a gate insulating layer 107 comprising a silicon oxide film is formed to a thickness of 80 nm to cover the active layers. Gate electrodes 108 and 109 are further formed on the gate insulating layer 107. As a material of the gate electrodes 108 and 109 in the embodiment mode, a 350 nm thick tungsten film or a tungsten alloy film is used. Of course, other known materials can be used as the material of the gate electrodes.

Then using the gate electrodes 108 and 109 as a mask, an element (typically boron) that belongs to Group 13 of the periodic table is doped. A known doping method may be used. Thus, impurity regions (hereinafter referred to as p-type impurity regions) 110 to 114 which indicate a p-type conductivity are formed. Further, channel firming regions 115 to 117 are defined right under the gate electrodes. Note that the p-type impurity regions 110 to 114 become a source region or a drain region of a TFT.

As shown in FIG. 1C next, a silicon nitride film is formed to a thickness of 50 nm, and thereafter, the element belonging to Group 13 of the periodic table that is doped through a heat treatment is activated. This activation process is performed by furnace annealing, laser annealing, or lamp annealing, or may be performed by a combination thereof. In embodiment mode, heat treatment is conducted under nitrogenic atmosphere of a temperature of 500° C. for 4 hours.

It is effective to perform a hydrogenation treatment after completing the activation of the doped element. The known hydrogen annealing technique or the plasma hydrogenation technique may be used in the hydrogenation treatment.

As shown in FIG. 1D, a first interlayer insulating layer 119 comprising a silicon oxide film is next formed to a thickness of 800 nm. Then a contact hole is formed to thereby form wirings 120 to 123. Other inorganic insulating layers may be used as the first interlayer insulating layer 119, or resin (organic insulating layer) may be used. In this embodiment mode, a metallic wiring consisting of a three-layered structure of titanium, aluminum, and titanium is used as the wirings 120 to 123. Of course, any material may be used as long as it is a conductive film. The wirings 120 to 123 become source wirings or drain wirings of the TFT.

A switching TFT 201 and a current control TFT (driver TFT) 202 are thus completed in this state. Both the TFTs are formed of a p-channel TFT in embodiment mode. However, the switching TFT 201 is formed such that the gate electrodes cut across the active layers in two places, resulting in a structure in which two channel forming regions are connected in series. By forming such a structure, an OFF current value (a current that flows when the TFT is turned OFF) can be effectively suppressed.

Figure 3A:
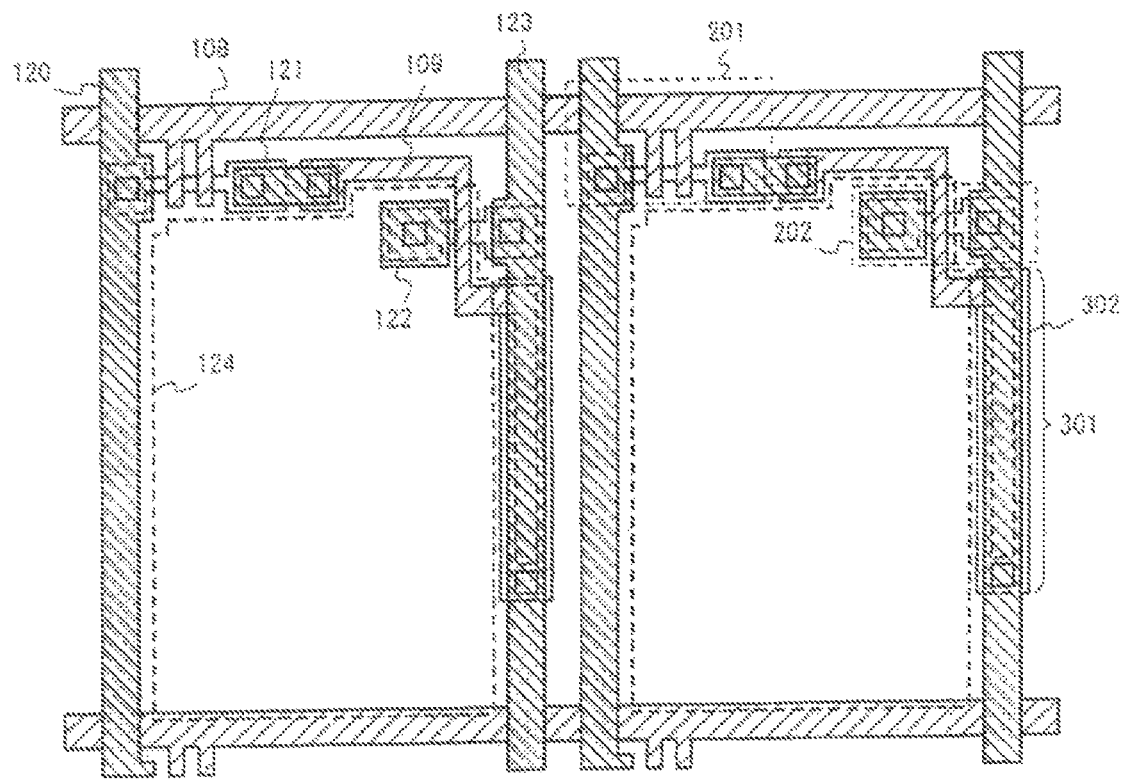
FIG. 3A is a diagram showing a top view of a structure of an EL an display device.
Figure 3B:
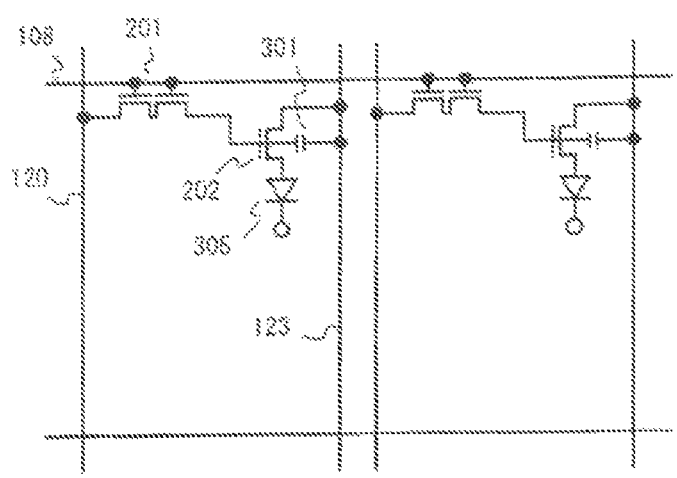
FIG. 3B is a diagram showing a circuit configuration thereof.

A storage capacitor 301 that is shown in FIGS. 3A and 3B is formed at the same time. The storage capacitor 301 is composed of a semiconductor layer 302 that is formed at the same time with the active layers, a bottom side storage capacitor that is formed of the gate insulating layer 107 and the gate electrode 109, and a top side storage capacitor that is formed of the gate electrode 109, the first interlayer insulating layer 119, and the wiring 123. Further, the semiconductor layer 302 is electrically connected to the wiring 123.

Next, as shown in FIG. 1D, a transparent conductive film (typically a compound film of indium oxide and tin oxide) is formed of thickness of 100 nm and then patterned to thereby form a pixel electrode 124. At this point, the wiring 122 and the pixel electrode 124 are in ohmic contact. Therefore, the pixel electrode 124 and the current control TFT 202 are electrically connected to each other. In addition, the pixel electrode 124 functions as an anode of an EL element.

Upon formation of the pixel electrode 124, a second interlayer insulating layer 125 comprising a silicon oxide film is formed to a thickness of 300 nm as shown in FIG. 1E. Then, an opening portion 126 is formed to a thickness of 300 nm as shown in FIG. 1E. Then, an opening portion 126 is formed to thereby form a 70 nm thick organic EL layer 127 and 300 nm thick cathode 128 by evaporation. In this embodiment mode, a structure laminated with a 20 nm thick hole injection layer and a 50 nm thick light-emitting layer is used as the organic EL layer 127. Of course, other known structures in which a hole injection layer, a hole transportation layer, an election transportation layer, and an electron injection layer are combined may be used as the light-emitting layer.

CuPc (copper phthalocyanine) is used as the hole injection layer in the embodiment mode of the present invention. In this case, copper phthalocyanine is first formed so as to cover all the pixel electrodes. Then, respective light-emitting layer luminescing red, light-emitting layer luminescing green, and light-emitting layer luminescing blue are formed in each of the pixels corresponding to the color red, green, and blue. A shadow mask may be used during evaporation to distinguish the regions where the respective light-emitting layers are to be formed. Thus, color display becomes possible.

It is to be noted that when forming the light-emitting layer luminescing green, $Alq_3$ (tris-8-quinolilite-aluminum complex) is used as the core material of the light-emitting layer, and quinacridone or coumarin 6 is doped as the dopant. Further, when forming the light-emitting layer luminescing red, $Alq_3$ is used as the core material of the light-emitting layer, and DCJT, DCM1, or DCM2 is doped as the dopant. When forming the light-emitting layer luminescing blue, $BAlq_3$ (a 5 ligand complex having 2-methyl-8-quinolinol and a mixed ligand of a phenol conductor) is used as the core material of the light-emitting layer, and perylene is doped as the dopant.

Of course, the present invention is not necessarily limited to the above organic material, and known low molecular type organic EL materials, high molecular type organic EL materials, and inorganic EL materials may be used. In case of using a high molecular type organic EL materials, an application method can also be employed.

Furthermore, not only a luminous material that goes through a singlet excitation but a luminous material that goes through a triplet excitation may be used. That is, not only a luminous material that emits a fluorescent light but a luminous material that emits a phosphorescent light may be used. The EL element (denoted by the reference symbol 305 in FIG. 3B) composed of the pixel electrode (anode) 124, the organic EL layer 127, and the cathode 128 is thus formed. In this embodiment mode, the EL element thus formed functions as a luminous element.

As shown in FIG. 2A, a substrate 130 for fixating the elements (hereinafter referred to as fixed substrate) is next bonded to the to the substrate 101 by a first adhesive 129. Although a flexible plastic film is used as the fixed substrate, a silicon substrate, and a ceramic substrate may be used. As a material of the first adhesive 129, it is necessary to use a material in which a selective ratio can be obtained during the removal of the peeling layer 102 afterwards.

Typically, an insulating layer comprising resin can be used, and polyimide is used in the embodiment mode. However, acrylic, polyamide, and epoxy resin may be used. Note that if the EL element is positioned on the side of an observer side of a user using the display device), it is necessary that a light transmissive material is used.

By carrying out the process of FIG. 2A, the EL element is completely cut off from an external atmosphere. Thus, the degradation of the organic EL material due to oxidation can be almost completely suppressed, whereby the reliability of the EL element can be immensely enhanced.

Figure 2B:
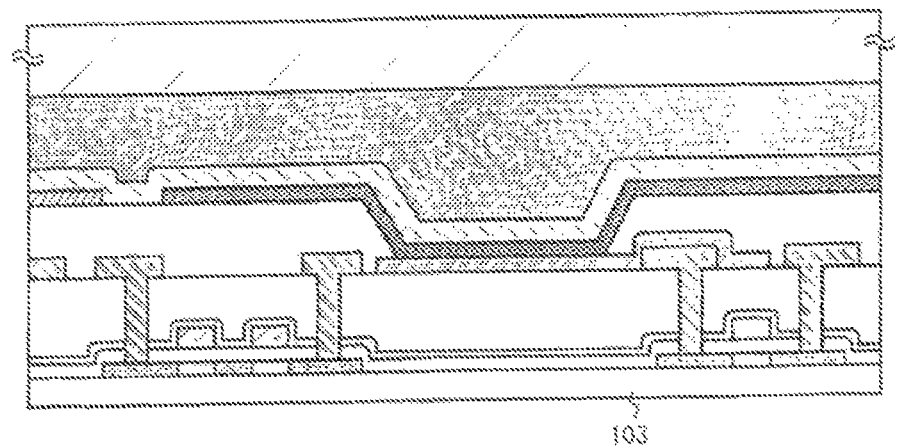

Next, as shown in FIG. 2B, the whole substrate having the EL element formed thereon is exposed in a gas containing halogen fluoride to thereby remove the peeling layer 102. In this embodiment mode, chlorine trifluoride ($ClF_3$) is used as the halogen fluoride and nitrogen as the diluted gas, Argon, helium, and neon may be used as the diluted gas. The flow rate for both the halogen fluoride and the diluted gas is set to 500 sccm ($8.35 \times 10^{-8}$ m$^3$/s), and the reaction pressure may be set to between 1 and 10 Torr ($1.3 \times 10^8$ to $1.3 \times 10^9$ Pa). Further, the treatment temperature may be set to room temperature (typically between 20 and 27° C.).

In this case, though the silicon film will be etched, the plastic film, the glass substrate, the polyimide film, and the silicon oxide film will not be etched. In other words, the peeling layer 102 is selectively etched by exposing the whole substrate to chlorine trifluoride ($ClF_3$) gas and will finally removed completely. It is to be noted that the active layers 105 and 106, which are formed of a silicon film, will not be exposed in the chlorine trifluoride gas since they are covered by the gate insulating layer 107, and therefore, the active layers 105 and 106 will not be etched.

In this embodiment mode, etching is performed gradually from the exposed edges of the peeling layer 102. At the point the peeling layer 102 is completely removed, the element-forming substrate 101 and the insulating layer 103 are separated from each other. Although the TFT and the EL element are formed in lamination, they remain in the form of being transferred to the fixed substrate 130 at this point.

Note that in this embodiment mode, the etching of the peeling layer 102 is performed from the edges thereof. However, this way of etching is not favorable when the element-forming substrate 101 is large, because the time to completely remove the peeling layer 102 will become long. Therefore, it is desirable to implement the embodiment mode of the present invention to cases where the element-forming substrate 101 is 3 inches or less in diagonal (preferably 1 inch or less in diagonal).

Figure 2C:
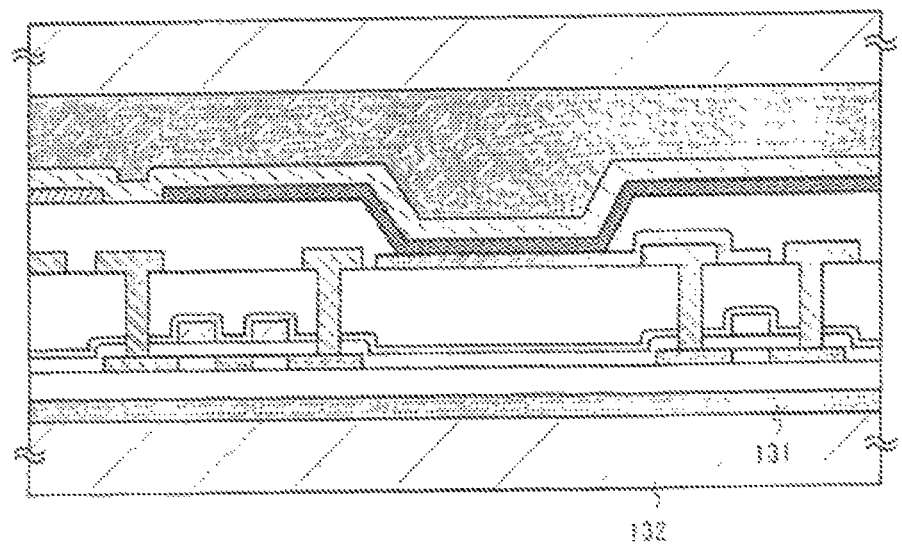

Thus, upon transferring the TFT and the EL element to the fixed substrate 130, a second adhesive 131 is formed to thereby bond a plastic film 132 as shown in FIG. 2C. An insulating layer comprising resin (typically, polyimide resin, acrylic resin, polyamide resin, and epoxy resin) or an inorganic insulating layer (typically silicon oxide film) may be used as the second adhesive 131. Note that if the EL element is positioned on the side of an observer when observed from the EL element, it is necessary that a light transmissive material is used.

The TFT and the EL element are thus transferred from the glass substrate 101 to the plastic film 132. As a result, a flexible EL display device sandwiched between the two sheets of plastic film 130 and 132 can be obtained. Thus, forming the fixed substrate (here it is a plastic film) 130 and the bonding substrate (here it is a plastic film) 132 with exactly the same material makes a thermal expansion coefficient thereof equivalent, thereby making it difficult for the substrates to be influenced by a stress distortion due to temperature changes.

In the EL display device manufactured in accordance with the embodiment mode of the present invention, the total number of masks necessary for photolithography is 6, an extremely small number. Accordingly, a high yield and a low manufacturing cost can be achieved. In addition, in the EL display device thus formed, the TFT that was formed without being limited by the heat resistance of the plastic substrate can be employed as a semiconductor element, whereby the EL display device can be made into an extremely high-performance display device.

Embodiment 1

In Embodiment 1, an explanation will be made of an example of a case where an EL display device is manufacturing by a method that is different from the one in the embodiment mode. The state shown in FIG. 1C is first obtained in accordance with the embodiment mode of the present invention. Then, after forming a silicon nitride film 118, a resist 401 is formed thereon. With the resist 401 as a mask, the silicon nitride film 118, a gate insulating layer 107, an insulating layer 103, and a peeling layer 102 are sequentially etched to thereby form opening portions 402 and 403 to reach an element-forming substrate 101. (See FIG. 4A)

Next, as shown in FIG. 4B, a first interlayer insulating layer 404 comprising resin is formed after the resist 401 is removed. A 2 μm thick polyimide film is used as the first interlayer insulating layer 404 in Embodiment 1. At this point, the element-forming substrate 101 and the first interlayer insulating layer 404 are bonded to each other at bottom portions of the opening portions 402 and 403.

As shown in FIG. 4C, a contact hole is next formed in the first interlayer insulating layer 404 to thereby form wirings 120 to 123. A pixel electrode 124 comprising a transparent conductive film is further formed. The formations of these wirings and electrodes are the same as those of the embodiment mode of the present invention.

Upon formation of the pixel electrode 124, as shown in FIG. 4D, the first interlayer insulating layer 404, the silicon nitride film 118, the gate insulating layer 107, and the insulating layer 103 are sequentially etched to thereby form opening portions 405 and 406 to reach the peeling layer 102.

Then, as shown in FIG. 4E, the whole substrate having the TFT formed thereon is exposed in a gas containing halogen fluoride to thereby remove the peeling layer 102. In Embodiment 1, chlorine trifluoride ($ClF_3$) is used as the halogen fluoride and nitrogen as the diluted gas. The flow rates for both the halogen fluoride and the diluted gas are set to 500 sccm (8.35×10⁻⁸ m³/s) and the reaction pressure is set to 10 Torr (1.3×10³ Pa). Further, the treatment temperature is set to 25° C.

In Embodiment 1, the chlorine trifluoride gas encroaches through the opening portions 405 and 406, and therefore, etching of the peeling layer 102 proceeds not only at the edges thereof but also from the interior of the substrate surface. Accordingly, the throughput of the removing process of the peeling layer 102 can be improved in Embodiment 1 compared with the case explained in the embodiment mode. Of course, other thin films, except the peeling layer 102, will not be etched by the chlorine trifluoride gas, and the active layers comprising a silicon film will also not be etched because they are protected by the silicon oxide film.

Figure 6:
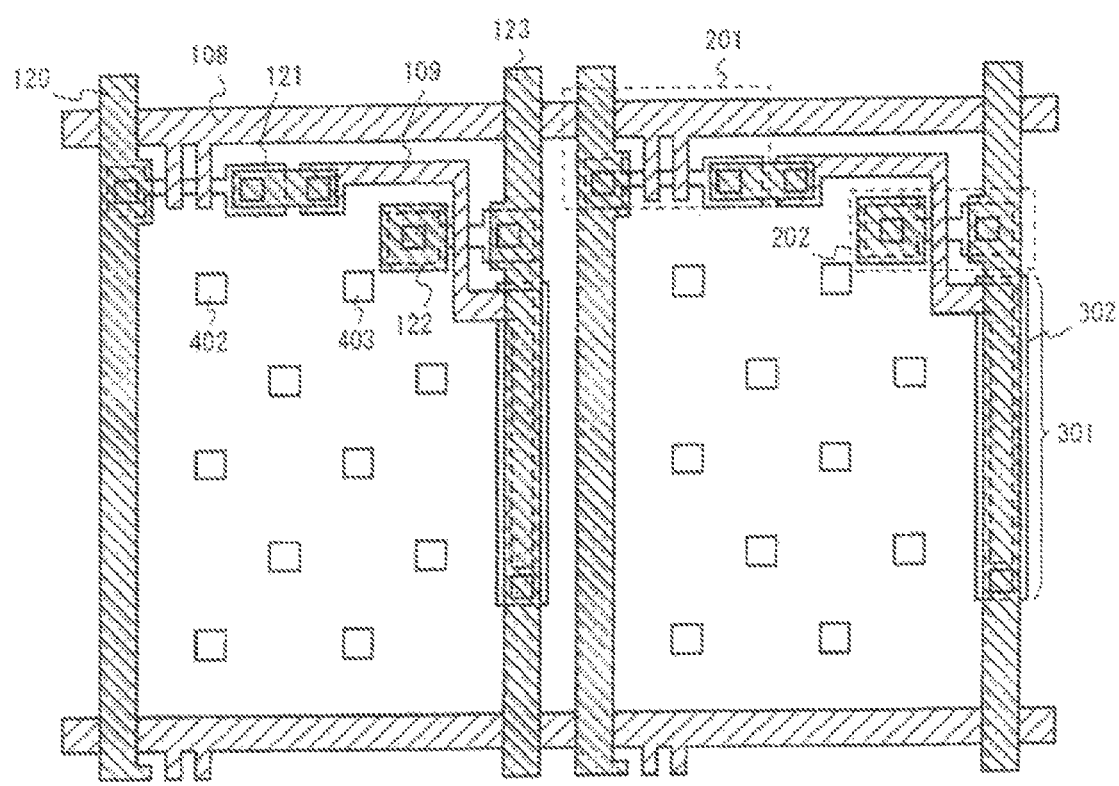
FIG. 6 is a diagram showing a top view of a structure of an EL display device.

Thus, by performing the removing process of the peeling layer 102, the element-forming substrate 101 becomes in such a state where it is bonded at the bottom portions of the opening portions 402 and 403 by the first interlayer insulating layer 404 as shown in FIG. 4E. As shown in FIG. 6, the opening portions 402 and 403 are actually formed in every place of the pixels, and therefore, it is possible to bond the substrate 101 with enough strength. Furthermore, even if the size of the element-forming substrate 101 is 3 inches or more in diagonal, the present invention may be sufficiently implemented in accordance with Embodiment 1.

Figure 5A:
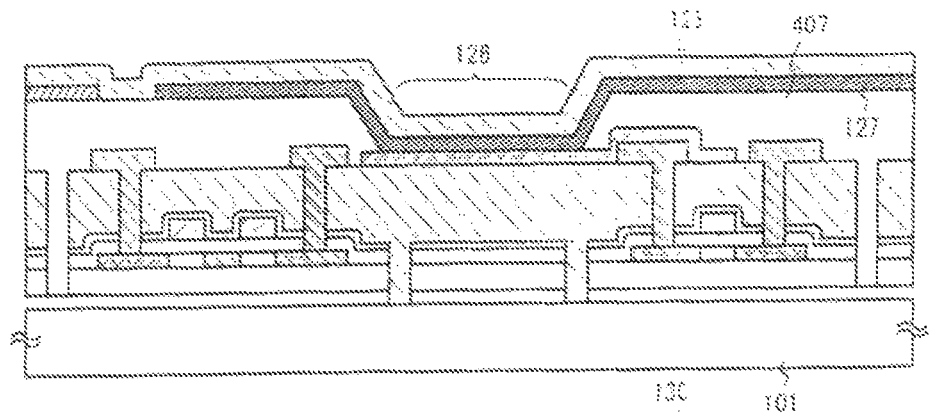
FIGS. 5A to 5C are diagrams showing manufacturing processes of an EL display device.

Next, as shown in FIG. 5A, a second interlayer insulating layer 407 that is provided with an opening portion 126 is formed. The second interlayer insulating layer 407 fulfills the role of filling up the opening portions 405 and 406. An organic EL layer 127 and a cathode 128 are formed to thereby complete the formation of the EL element. Regarding the material, structure, or formation method of the organic EL layer 127 and the cathode 128, the explanation made in the embodiment mode may be referenced.

Figure 5B:
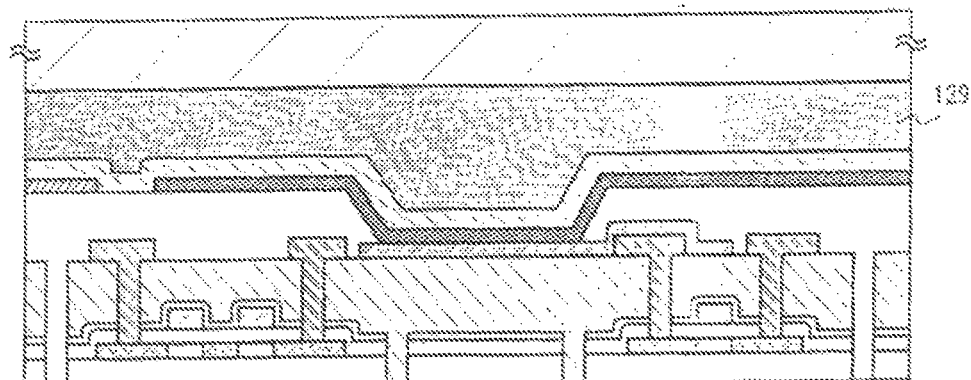
Figure 5C:
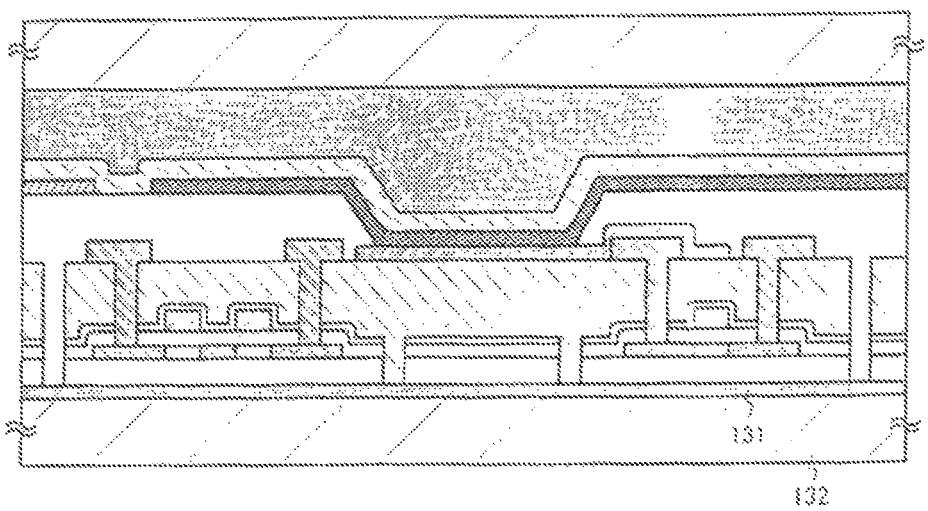

A fixed substrate 130 is next bonded by using a first adhesive (epoxy resin in Embodiment 1) 129 as shown in FIG. 5B. Further, a plastic substrate is used as the fixed substrate 130 in Embodiment 1, whereby the EL element can thus be completely cut off from an external thereof.

Upon separation of the element-forming substrate 101 from the first interlayer insulating layer 404, a bending substrate 132 is bonded thereto by using a second adhesive 131. In Embodiment 1, a polyimide film is used as the second adhesive 131, and a plastic substrate is employed as the bonding substrate 132. Thus, forming the fixed substrate 130 and the bonding substrate 132 with the same material makes a thermal expansion coefficient thereof equivalent, thereby making it difficult for the substrates to be influenced by a stress distortion due to temperature changes.

In the EL display device manufactured in accordance with Embodiment 1, the total number of masks necessary for photolithography is 6, an extremely small number. Accordingly, a high yield and a low manufacturing cost can be achieved. In addition, in the EL display device thus formed, the TFT that was formed without being limited by the heat resistance of the plastic substrate can be employed as a semiconductor element, whereby the EL display device can be made into an extremely high-performance display device.

Embodiment 2

In the embodiment mode or Embodiment 1 of the present invention, it is effective to employ any of the inventions disclosed in Japanese Patent Application Laid-open No. Hei 9-312260, Japanese Patent Application Laid-open Hei 10-247735, Japanese Patent Application Laid-open No. Hei 10-270363, and Japanese Patent Application Laid-open No. Hei 11-191628 by the present applicant for manufacturing processes up to the formation of the gate electrode.

All the techniques disclosed in the above-mentioned applications are techniques for forming a crystalline silicon film that has an extremely high crystallinity. Thus, TFTs having a very high performance may be formed by employing these techniques. Although heat treatment conducted at a temperature of 550° C. or more is included in any of these techniques, it becomes possible to use a low heat resistant plastic substrate as the element-forming substrate by employing the technique of the present invention.

It is to be noted that the constitution of Embodiment 2 may be implemented by freely combining it with constitution of the embodiment mode or Embodiment 1.

Embodiment 3

In Embodiment 3, an explanation will be made on an example of a case where the present invention is employed in a liquid crystal display device with reference to FIGS. 7A to 7C.

Figure 7A:
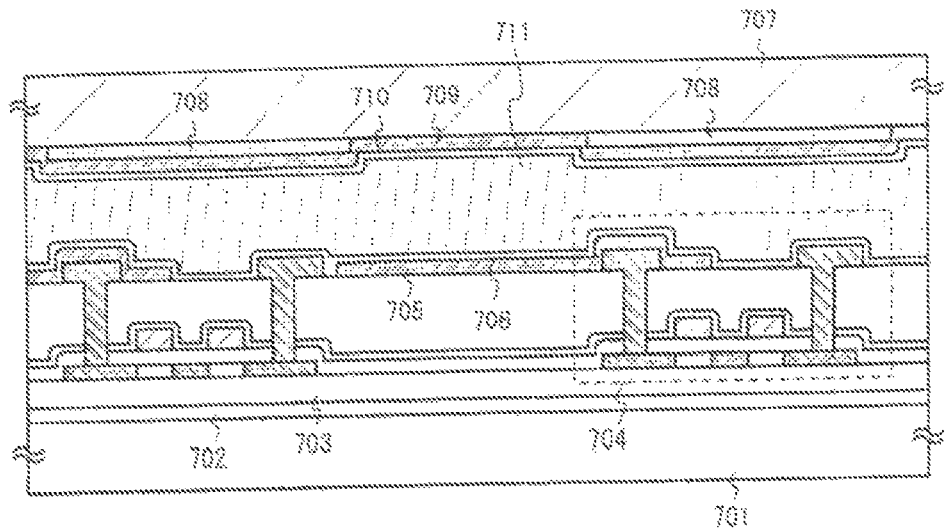
FIGS. 7A to 7C are diagrams showing manufacturing processes of a liquid crystal display device.

In FIG. 7A, reference symbol 701 denotes an element-forming substrate comprising glass, reference symbol 702 denotes a peeling layer comprising an amorphous silicon film, reference symbol 703 denotes an insulating layer comprising a silicon oxide nitride film, and a reference symbol 704 denotes a pixel TFT. The pixel TFT 704 is a P channel TFT that is manufactured in accordance with the processes explained in the embodiment mode. In Embodiment 3, the pixel TFT 704 will be used as a switching element for controlling a voltage applied to a liquid crystal. Further, reference symbol 705 denotes a pixel electrode formed from a transparent conductive film that is electrically connected to the pixel TFT 704.

The above described structure may be formed in accordance with the manufacturing processes that were explained in the embodiment mode of the present invention. Of course, the manufacturing processes of the TFT are not necessarily limited to the processes explained in the embodiment mode. The structure of the TFT may be a bottom gate type.

Upon formation of the pixel TFT 704 and the pixel electrode 705, an orientation film 706 comprising resin is formed to a thickness of 60 nm. The orientation film 706 may be formed by the printing method.

An opposing substrate 707 comprising a plastic film is prepared next, and a light shielding film 708 comprising titanium is formed thereon to thickness of 120 nm. An opposing electrode 709 made from a transparent conductive film is further formed to a thickness of 110 nm. Then, an orientation film 710 is formed to a thickness of 60 nm on the opposing electrode 709.

Next, a sealing member (not shown in the figure) is formed on the orientation film 706 of the element-forming substrate side by using a dispenser or the like. Then, a pressurized press is applied to the orientation film 706 of the element-forming substrate side and the orientation film 710 of the opposing substrate side to thereby bond them so as to be faced with each other. A liquid crystal 711 is then injected into a space surrounded by the sealing member by using the vacuum injection method. Resin is used to seal up the injection opening of the sealing member, thereby completing the liquid crystal cell. The processes above may be implemented by adopting known manufacturing processes of liquid crystal cells.

At this point, polyimide resin, acrylic resin, or epoxy resin is used as the not shown sealing member. However, it is necessary to use a material that will secure a selective ratio during the etching of the peeling layer 702 is a subsequent process. The sealing member fulfills the same role as that of the first adhesive 129 of FIG. 2A.

Figure 7B:
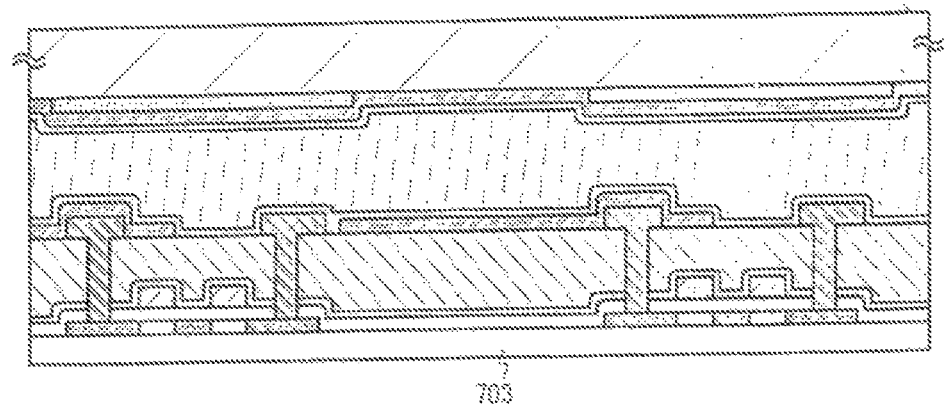
Figure 7C:
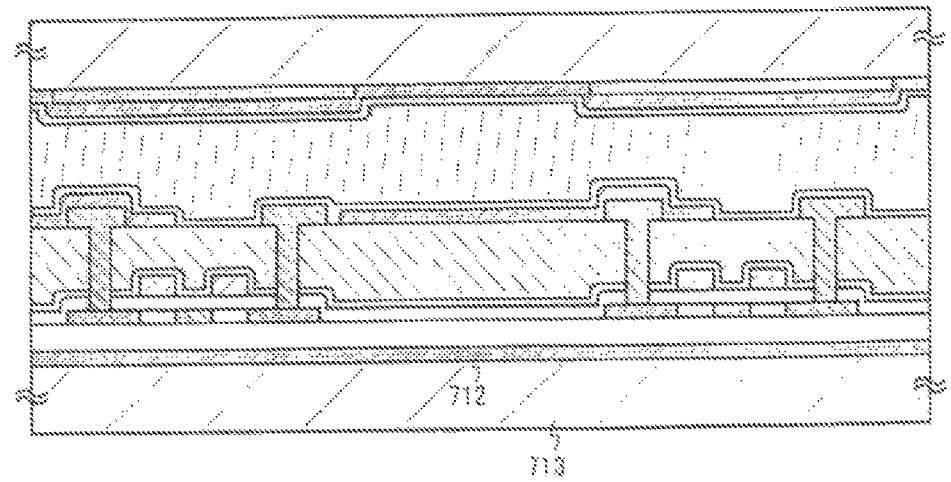

As shown in FIG. 7B next, the entire liquid crystal cell is exposed in a gas containing halogen fluoride to thereby etch the peeling layer 702. In Embodiment 3, chlorine trifluoride is used as the halogen fluoride, and argon is employed as the diluted gas. It is to be noted that in Embodiment 3, because etching of the peeling layer 702 is performed in a state where the peeling layer is covered by the element-forming substrate 701, the exposed surfaces of the peeling layer 702 are gradually etched first.

The peeling layer 702 is thus completely removed, whereby the insulating layer 703 comprising the silicon nitride oxide film is exposed. The opposing substrate 707 functions as a fixed substrate for fixating the shape of the element at this point.

Finally, a bonding substrate 713 is bonded by using a second adhesive 712 that comprises an acrylic film. In Embodiment 3, a plastic film is employed as the bonding substrate 713. A plastic substrate may of course be employed.

Thus, in case of employing the present invention in a liquid crystal display device, the liquid crystal display device is once completed at the point of completing the injection process of the liquid crystal. Thereafter, the removing process of the peeling layer can be carried out by utilizing the opposing substrate as the fixed substrate. Accordingly, a high-performance TFT can be manufactured on a plastic substrate without particularly increasing complex steps.

Note that in accordance with the method explained in Embodiment 1, the element-forming substrate and the bonding substrate may be rebonded before the injection of the liquid crystal. This case can be readily implemented by freely combining the constitution of Embodiment 1 and the constitution of Embodiment 3. Further, the constitution of Embodiment 3 may be freely combined with the constitution of Embodiment 2.

Embodiment 4

In Embodiment 4, an explanation will be made on an example of a case where the present invention is employed in a simple matrix type EL display device with reference to FIGS. 8A to 8C.

Figure 8A:
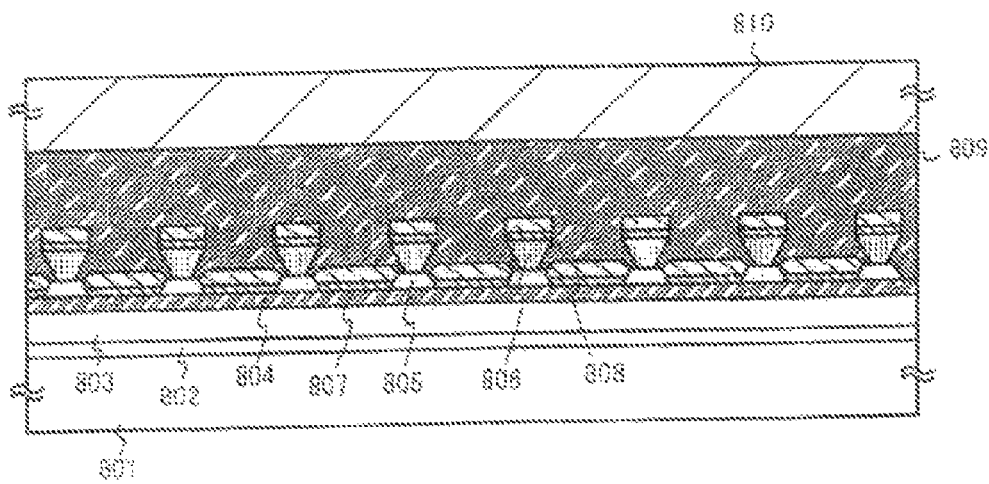
FIGS. 8A to 8C are diagrams showing manufacturing processes of an EL display device.
Figure 8B:
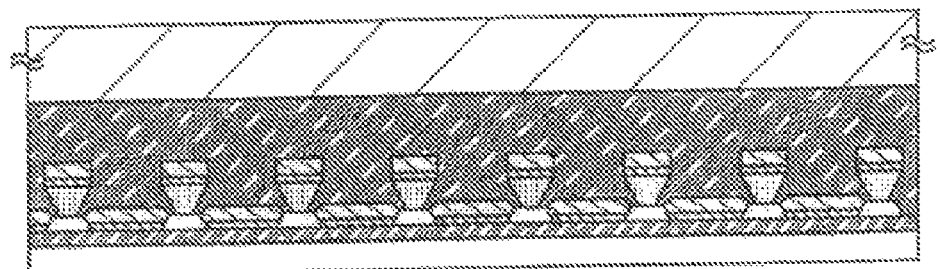
Figure 8C:
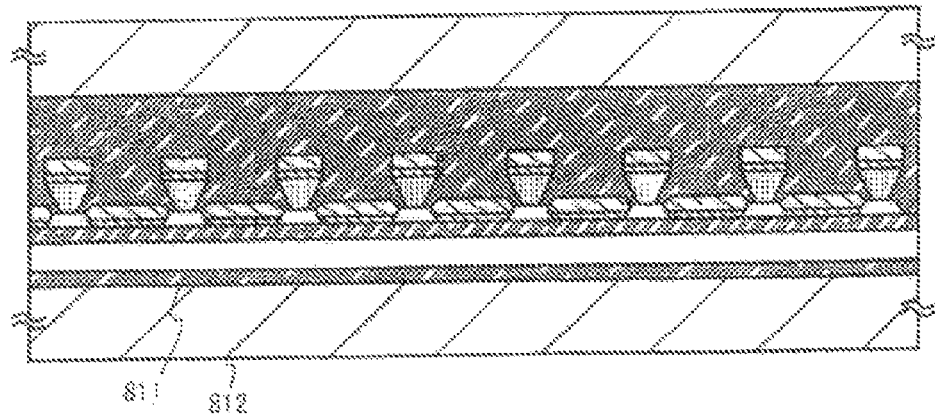

In FIG. 8A, reference symbol 801 denotes an element-forming substrate comprising glass, reference symbol 802 denotes a peeling layer comprising an amorphous silicon film, reference symbol 803 denotes an insulating layer comprising a silicon nitride oxide film, and reference symbol 804 denotes a first stripe electrode that is a anode comprising a transparent conductive film in Embodiment 4. A plurality of anodes 804 are formed in stripe shapes in a direction that is parallel to the defined space.

An element separating insulating layer 805 and a plurality of stripe-shape banks 806 made from a resin film are formed on the first stripe electrode 804. The element separating insulating layer 805 and the plurality of stripe-shape banks 806 are formed such that they are orthogonal to the above-mentioned first stripe electrode 804. Thus, upon formation of the element separating insulating layer 805 and the plurality of stripe-shape electrode (a cathode comprising a metallic film Embodiment 4) 808 are formed by evaporation. Because the second stripe electrode 808 is formed so as to be separated into a stripe shape by the plurality of stripe-shape banks 806, it is formed so as to be orthogonal to the stripe electrode 804.

At this point, a capacitor that is formed of the first stripe electrode (here it is an anode) 804, the organic EL layer 807, and the second stripe electrode (here it is a cathode) 808 becomes an EL element. Of course, known formation methods and known materials may be used for forming the first stripe electrode 804, the organic EL layer 807, and the second stripe electrode 808.

Upon formation of the EL element, a plastic film 810 is bonded by using a first adhesive (acrylic in Embodiment 4) 809. Thus, the EL element can be made into a state where it is completely cut off from an external atmosphere.

Next, the substrate having the EL element formed thereon is exposed in a nitrogenic atmosphere containing chlorine trifluoride gas to thereby remove the peeling layer 802 by etching. Then the EL element and the element-forming substrate 801 are separated from each other.

A bonding substrate 812 is next bonded by using a second adhesive 811. In Embodiment 4, a polyimide film is used as the second adhesive 811, and a plastic film is employed as the bonding substrate 812.

In the EL display device manufactured in accordance with Embodiment 4, the total number of masks necessary for photolithography is 2, which is an extremely small number. Accordingly, a high yield and a low manufacturing cost can be achieved. Note that the constitution of Embodiment 4 may be implementing by combining it with the constitution of Embodiment 2.

Embodiment 5

An explanation will be made with reference to FIGS. 9A to 9C on a case of adhering a bonding substrate that has been previously provided with a color filter in Embodiment 5.

First, the state of FIG. 5A is obtained in accordance with embodiment 2. However, an organic EL layer 901 luminescing a white light is formed in Embodiment 5 instead of the organic EL layer 127. To be more specific, a material disclosed in Japanese Patent Application Laid-open No. Hei 8-96959 or Japanese Patent Application Laid-open No. Hei 9-63770 may be used for a light-emitting layer. In Embodiment 5, what is obtained by dissolving PVK (polyvinyl carbazole), Bu-PBD (2-(4' tert-butylphenyl)-5-(4"-biphenyl)-1, 3,4-oxadiazole), coumarin 6, DCM1 (4-dicyanomethylene-2-methyl-6-p-dimethylaminostyryl-4H-pyran), TPB (tetraphenylbutaiene), and Nite Red in 1,2-dichloromethane is used as the light-emitting layer. In addition, a cathode 902 made from an alloy film of aluminum and lithium is formed on the organic EL layer 901.

As shown in FIG. 9B, a fixed substrate (plastic film in Embodiment 5) 904 is next bonded by using a first adhesive (polyimide film in Embodiment 5) 903. Then, an element-forming substrate 101 is separated.

Next, as shown in FIG. 9C, a bonding substrate (plastic film in Embodiment 5), which is provided with a color filter 905 that corresponds to a red color, a color filter 906 that corresponds to a green color, and a color filter 907 that corresponds to a blue color, is bonded by using a second adhesive (epoxy resin in Embodiment 5) 909.

At this point, because the color filters can be formed by employing a combination of spin coating and a photolithography technique or a printing method, the color filters can be formed on the plastic film without any problem. Further, an improvement in yield can be expected compared with the case of forming the color filters on the element-forming substrate.

Note that the constitution of Embodiment 5 may be implemented by freely combining it with any of the constitutions of the embodiment mode and Embodiments 1 to 4.

Embodiment 6

In Embodiment 6, it is effective to form a DLC (diamond like carbon) form on one surface or both surfaces of a fixed substrate and/or the bonding substrate. However, if the thickness of the DLC film is too thick, transmittance will drop. Therefore, the DLC film may be formed to a thickness of 50 nm or less (preferably between 10 and 20 nm).

A characteristic of the DLC film is that it has an asymmetric peak of about 1550 $cm^{-1}$ and has a Raman spectrum distribution with a shoulder of about 1300 $cm^{-1}$. In addition, the DLC film also has a characteristic showing hardness of 15 to 25 Pa when measured by a microhardness device.

Because the hardness of the DLC film is stronger and the thermal conductivity thereof is large compared with the plastic substrate, its provision as a protecting film for protecting the surface of the substrate is effective.

Therefore, the DLC film may be formed in advance before the bonding of the plastic substrate, or the DLC film may be formed after the bonding of the plastic substrate. In any case, the DLC film may be formed by sputtering or ECR plasma CVD.

Note that the constitution of Embodiment 6 may be implemented by freely combining it with any of the constitutions of Embodiments 1 to 5.

Embodiment 7

Examples of the display device employing the EL element were explained in Embodiments 1, 2, and 4 to 6. However, the present invention may also be employed in an EC (Electro Chromic) display device, a field emission display (FED), or a display device having a light-emitting diode that employs a semiconductor.

In the present invention, because a substrate (element-forming substrate) that has a higher heat resistance than plastic is used in the manufacturing processes of the semiconductor element, a semiconductor element having a high electric characteristic can thus be manufactured. Further, the aforementioned element-forming substrate is separated after the formation of the semiconductor element and the luminous element to thereby bond the plastic substrate.

Therefore, it is possible to employ a plastic substrate as the supporting substrate and to manufacture a high-performance display device. It is further possible to manufacture a flexible display device because the supporting substrate is plastic and to make the display device light in weight.

What is claimed is:

1. A method of manufacturing a display device, comprising the steps of:
    forming a peeling layer on an element-forming substrate;
    forming an insulating layer on said peeling layer;
    forming an active layer, a gate insulating layer, and gate electrodes over said insulating layer;
    forming first openings in said gate insulating layer, said insulating layer, and said peeling layer;
    forming a first interlayer insulating layer to cover said gate electrodes;
    forming wirings and a pixel electrode on said first interlayer insulating layer;
    forming second openings in said first interlayer insulating layer, said gate insulating layer, and said insulating layer to thereby expose said peeling layer;
    exposing the entire substrate to a gas containing halogen fluoride to thereby remove said peeling layer;
    forming a second interlayer insulating layer to cover said wirings and said pixel electrode;
    etching said second interlayer insulating layer to thereby expose said pixel electrode;
    forming a luminous layer and a cathode on said pixel electrode;
    bonding a fixed substrate on said cathode by using a first adhesive;
    removing said element-forming substrate after bonding said fixed substrate; and
    bonding a bonding substrate to said insulating layer by using a second adhesive.

2. A method according to claim 1, wherein polyimide, acrylic, or epoxy resin is used as said first adhesive.

3. A method according to claim 1, wherein a material used for forming said bonding substrate is the same as that for forming said fixed substrate.

4. A method of manufacturing a display device, comprising the steps of:
    forming a peeling layer on an element-forming substrate;
    forming an insulating layer on said peeling layer;
    forming active layers, a gate insulating layer, and gate electrodes over said insulating layer;
    forming first openings in said gate insulating layer, said insulating layer, and said peeling layer;
    forming a first interlayer insulating layer to cover said gate electrodes;
    forming wirings and a pixel electrode on said first interlayer insulating layer;
    forming second opening in said first interlayer insulating layer, said gate insulating layer, and said insulating layer to thereby expose said peeling layer;
    removing said peeling layer;
    forming a second interlayer insulating layer to cover said wirings and said pixel electrode;
    etching said second interlayer insulating layer to thereby expose said pixel electrode;
    forming a luminous layer and a cathode on said pixel electrode;
    bonding a fixed substrate on said cathode by using a first adhesive;
    removing said element-forming substrate after bonding said fixed substrate; and
    bonding a bonding substrate to said insulating layer by using a second adhesive.

5. A method according to claim 4, wherein polyimide, acrylic, or epoxy resin is used as said first adhesive.

6. A method according to claim 4, wherein a material used for forming said bonding substrate is the same as that for forming said fixed substrate.

7. A method of manufacturing a display device, comprising the steps of:
    forming a peeling layer on an element-forming substrate;
    forming an insulating layer on said peeling layer;
    forming active layers, a gate insulating layer, and gate electrodes over said insulating layer;
    forming first openings in said gate insulating layer, said insulating layer, and said peeling layer;
    forming a first interlayer insulating layer to cover said gate electrodes;
    forming wirings and a pixel electrode on said first interlayer insulating layer;
    forming second opening in said first interlayer insulating layer, said gate insulating layer, and said insulating layer to thereby expose said peeling layer;
    removing said peeling layer;
    forming a second interlayer insulating layer to cover said wirings and said pixel electrode;

etching said second interlayer insulating layer to thereby expose said pixel electrode;

forming a luminous layer and a cathode on said pixel electrode;

bonding a fixed substrate on said cathode by using a first adhesive;

removing said element-forming substrate after bonding said fixed substrate; and bonding a bonding substrate to said insulating layer by using a second adhesive, wherein the luminous layer emits a white light.

8. A method according to claim 7, wherein polyimide, acrylic, or epoxy resin is used as said first adhesive.

9. A method according to claim 7, wherein a material used for forming said bonding substrate is the same as that for forming said fixed substrate.

10. A method according to claim 7, wherein said bonding substrate is provided with a color filter.

11. A method according to claim 4, further comprising a step of exposure to a gas containing halogen fluoride, thereby removing the peeling layer.

12. A method according to claim 7, further comprising a step of exposure to a gas containing halogen fluoride, thereby removing the peeling layer.

13. A method according to claim 1, wherein the active layer comprises an optically active element.

* * * * *

UNITED STATES PATENT AND TRADEMARK OFFICE
CERTIFICATE OF CORRECTION

| | | |
|---|---|---|
| PATENT NO. | : 7,862,677 B2 | |
| APPLICATION NO. | : 11/421168 | |
| DATED | : January 4, 2011 | |
| INVENTOR(S) | : Nakajima et al. | |

It is certified that error appears in the above-identified patent and that said Letters Patent is hereby corrected as shown below:

Column 1, line 28, replace "top" with --to--;

Column 1, line 29, replace "carries" with --carriers--;

Column 1, line 31, replace "alight-emitting" with --a light-emitting--;

Column 2, line 8, replace "lever" with --layer--;

Column 2, line 63, replace "rotation" with --portion--;

Column 3, line 41, after "channel" replace "firming" with --forming--;

Column 4, lines 29-31, delete "Then, an opening portion 126 is formed to a thickness of 300 nm as shown in FIG. IE.";

Column 4, line 37, replace "election" with --electron--;

Column 5, lines 14-15, after "fixed substrate," insert --130 in the embodiment mode, a glass substrate, a quartz substrate, a plastic substrate,--;

Column 5, line 37, replace "($8.35 \times 10^{-8}$ m$^3$/s)" with --($8.35 \times 10^{-6}$ m$^3$/s)--;

Column 5, line 38, replace "($1.3 \times 10^8$ to $1.3 \times 10^9$ Pa)" with --($1.3 \times 10^2$ to $1.3 \times 10^3$ Pa)--;

Column 6, lines 35-36, replace "manufacturing" with --manufactured--;

Column 7, line 2, replace "($8.35 \times 10^{-8}$ m$^3$/s)" with --($8.35 \times 10^{-6}$ m$^3$/s)--;

Column 7, line 3, replace "($1.3 \times 10^3$ Pa)" with --($1.3 \times 10^3$ Pa)--;

Signed and Sealed this
Twenty-fourth Day of May, 2011

David J. Kappos
*Director of the United States Patent and Trademark Office*

Column 7, lines 39-40, after "external" insert --atmosphere. Then the element-forming substrate 101 that is adhered at the bottom portions of the opening portions 402 and 203 is separated from the first interlayer insulating layer 404. This process may be performed mechanically, or heat treatment may be conducted to perform the separation--;

Column 7, line 42, replace "bending" with --bonding--;

Column 9, lines 59-60, after "the plurality of stripe-shape" insert --banks 806 that are made from the resin film, an organic EL layer 807 and a second stripe--;

Column 9, line 65, before "stripe electrode 804" insert --first--;

Column 10, line 25, replace "implementing" with --implemented--;

Column 10, line 44, replace "TPB (tetraphenylbutaiene), and Nite" with --TPB (tetraphenylbutadiene), and Nile--;

Column 11, line 4, replace "form" with --film--.